(12) United States Patent
Yoshimi

(10) Patent No.: US 11,760,284 B2
(45) Date of Patent: Sep. 19, 2023

(54) ELECTRONIC CONTROL UNIT AND POWER SUPPLY SYSTEM

(71) Applicant: DENSO CORPORATION, Kariya (JP)

(72) Inventor: Tomoaki Yoshimi, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 17/806,913

(22) Filed: Jun. 14, 2022

(65) Prior Publication Data

US 2022/0306019 A1    Sep. 29, 2022

Related U.S. Application Data

(63) Continuation of application No. PCT/JP2020/046490, filed on Dec. 14, 2020.

(30) Foreign Application Priority Data

Dec. 17, 2019  (JP) ................ 2019-227129

(51) Int. Cl.
| | | |
|---|---|---|
| *B62D 3/12* | (2006.01) | |
| *B60R 16/03* | (2006.01) | |
| *H02K 11/33* | (2016.01) | |
| *H02M 7/48* | (2007.01) | |
| *H05K 7/14* | (2006.01) | |
| *B62D 5/04* | (2006.01) | |

(52) U.S. Cl.
CPC .............. *B60R 16/03* (2013.01); *H02K 11/33* (2016.01); *H02M 7/48* (2013.01); *H05K 7/1432* (2013.01); *B62D 5/0484* (2013.01)

(58) Field of Classification Search
CPC ......... B60R 16/03; H02M 7/48; H02K 11/33; B62D 5/0484
See application file for complete search history.

(56) References Cited

U.S. PATENT DOCUMENTS

| | | | |
|---|---|---|---|
| 2017/0085205 A1* | 3/2017 | Koseki | ................ H02P 25/22 |
| 2017/0217481 A1* | 8/2017 | Asao | ................ B62D 5/0487 |
| 2018/0219397 A1* | 8/2018 | Matsushita | ............ H02J 7/342 |
| 2020/0377143 A1* | 12/2020 | Miyachi | ................ H02M 1/32 |
| 2022/0123684 A1* | 4/2022 | Gomi | ................ H02P 27/08 |

FOREIGN PATENT DOCUMENTS

| | | |
|---|---|---|
| JP | 2017-077832 A | 4/2017 |
| JP | 2019-130924 A | 8/2019 |

* cited by examiner

*Primary Examiner* — Jared Fureman
*Assistant Examiner* — Esayas G Yeshaw
(74) *Attorney, Agent, or Firm* — MASCHOFF BRENNAN

(57) ABSTRACT

A power relay unit includes a high potential side relay connected so that an anode of a parasitic diode is on a high potential side and a cathode is on a low potential side, and a low potential side relay connected in series with a low potential side of the high potential side relay so that a cathode of a parasitic diode is on a high potential side and an anode is on a low potential side. A relay-to-relay connection line connects an intermediate point between the first high potential side relay and the first low potential side relay and an intermediate point between the second high potential side relay and the second low potential side relay. A control unit controls an on/off operation of the first high potential side relay based on a first supply voltage, a second supply voltage, and a relay intermediate voltage.

6 Claims, 9 Drawing Sheets

ELECTRONIC CONTROL UNIT AND POWER SUPPLY SYSTEM

CROSS REFERENCE TO RELATED APPLICATIONS

This application is a continuation application of International Patent Application No. PCT/JP2020/046490 filed on Dec. 14, 2020, which designated the U.S. and based on and claims the benefits of priority of Japanese Patent Application No. 2019-227129 filed on Dec. 17, 2019. The entire disclosure of all of the above applications is incorporated herein by reference.

TECHNICAL FIELD

The present disclosure relates to an electronic control unit and a power supply system.

BACKGROUND

Conventionally, a steering device including an ECU that operates by being supplied with electric power from two batteries is known.

SUMMARY

An object of the present disclosure is to provide an electronic control unit and a power supply system that can continue to operate appropriately even if an abnormality occurs in one of the power supplies.

An electronic control unit of the present disclosure includes a first power supply relay unit, a second power supply relay unit, a relay-to-relay connection line, a first relay control circuit, a second relay control circuit, and a control unit.

The first power supply relay unit includes a first high potential side relay, which is connected so that an anode of a parasitic diode is on a high potential side and a cathode is on a low potential side, and a first low potential side relay, which is connected in series with the low potential side of the first high potential side relay so that a cathode of a parasitic diode is on the high potential side and an anode is on the low potential side, and is connected to a first external power source.

The second power supply relay unit includes a second high potential side relay, which is connected so that an anode of a parasitic diode is on a high potential side and a cathode is on a low potential side, and a second low potential side relay, which is connected in series with the low potential side of the second high potential side relay so that a cathode of a parasitic diode is on the high potential side and an anode is on the low potential side, and is connected to a second external power source different from the first external power source.

The relay-to-relay connection line connects an intermediate point between the first high potential side relay and the first low potential side relay and an intermediate point between the second high potential side relay and the second low potential side relay. The first relay control circuit includes a first relay driver that drives the first high potential side relay, a first upper monitor circuit that monitors a first supply voltage on the high potential side of the first high potential side relay, and a first lower monitor circuit that monitors a relay intermediate voltage, which is a voltage of the relay-to-relay connection line on the low potential side of the first high potential side relay.

The second relay control circuit includes a second relay driver that drives the second high potential side relay, a second upper monitor circuit that monitors a second supply voltage on the high potential side of the second high potential side relay, and a second lower monitor circuit that monitors a relay intermediate voltage on the low potential side of the high potential side of the second high potential side relay.

The control unit controls an on/off operation of the first high potential side relay and the second high potential side relay based on the first supply voltage, the second supply voltage, and the relay intermediate voltage. As a result, even if an abnormality occurs in the first external power supply or the second external power supply, the operation can be continued appropriately.

BRIEF DESCRIPTION OF DRAWINGS

The above and other objects, features and advantages of the present disclosure will become more apparent from the following detailed description made with reference to the accompanying drawings.

In the drawings.

DETAILED DESCRIPTION

Figure 1:
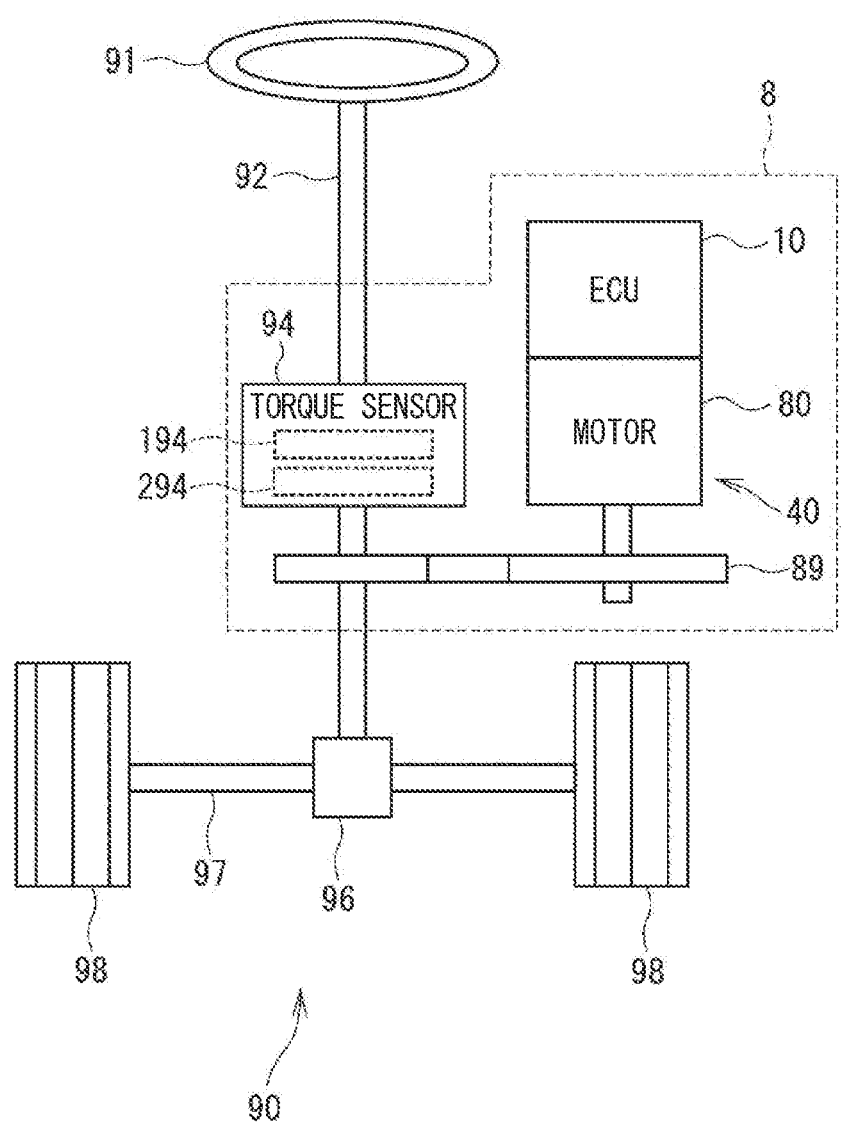
FIG. 1 is a schematic structural diagram illustrating a steering system according to an embodiment.

In an assumable example, a steering device including an ECU that operates by being supplied with electric power from two batteries is known. For example, two ECUs are provided with a power relay for switching on/off of power supply to a drive circuit of an own system and an auxiliary power supply relay for switching on/off of power supply to a drive circuit of another system.

In a circuit configuration of the example, when a regenerative power is large, there is a possibility that power exceeding an allowable amount of a battery is supplied depending on an on/off timing of an auxiliary power relay. In order to avoid excessive power regeneration to the battery side, if the power supply is temporarily turned off before turning on the auxiliary power relay, the power supply to the microcomputer is also cut off, so it is necessary to take measures against temporary power cutoff. An object of the present disclosure is to provide an electronic control unit and a power supply system that can continue to operate appropriately even if an abnormality occurs in one of the power supplies.

An electronic control unit of the present disclosure includes a first power supply relay unit, a second power supply relay unit, a relay-to-relay connection line, a first relay control circuit, a second relay control circuit, and a control unit.

The first power supply relay unit includes a first high potential side relay, which is connected so that an anode of a parasitic diode is on a high potential side and a cathode is on a low potential side, and a first low potential side relay, which is connected in series with the low potential side of the first high potential side relay so that a cathode of a parasitic diode is on the high potential side and an anode is on the low potential side, and is connected to a first external power source.

The second power supply relay unit includes a second high potential side relay, which is connected so that an anode of a parasitic diode is on a high potential side and a cathode is on a low potential side, and a second low potential side relay, which is connected in series with the low potential side of the second high potential side relay so that a cathode of a parasitic diode is on the high potential side and an anode is on the low potential side, and is connected to a second external power source different from the first external power source.

The relay-to-relay connection line connects an intermediate point between the first high potential side relay and the first low potential side relay and an intermediate point between the second high potential side relay and the second low potential side relay. The first relay control circuit includes a first relay driver that drives the first high potential side relay, a first upper monitor circuit that monitors a first supply voltage on the high potential side of the first high potential side relay, and a first lower monitor circuit that monitors a relay intermediate voltage, which is a voltage of the relay-to-relay connection line on the low potential side of the first high potential side relay.

The second relay control circuit includes a second relay driver that drives the second high potential side relay, a second upper monitor circuit that monitors a second supply voltage on the high potential side of the second high potential side relay, and a second lower monitor circuit that monitors a relay intermediate voltage on the low potential side of the high potential side of the second high potential side relay.

The control unit controls an on/off operation of the first high potential side relay and the second high potential side relay based on the first supply voltage, the second supply voltage, and the relay intermediate voltage. As a result, even if an abnormality occurs in the first external power supply or the second external power supply, the operation can be continued appropriately.

One Embodiment

Hereinafter, an electronic control unit according to the present disclosure will be described with reference to the drawings. The electronic control unit according to one embodiment is shown in FIGS. 1 to 9. As shown in FIG. 1, an ECU 10 as an electronic control unit is applied to, for example, an electric power steering device 8 for assisting a steering operation of a vehicle. FIG. 1 shows a configuration of a steering system 90 including the electric power steering device 8. The steering system 90 includes a steering wheel 91 as a steering member, a steering shaft 92, a pinion gear 96, a rack shaft 97, wheels 98, the electric power steering device 8, and the like.

The steering wheel 91 is connected to the steering shaft 92. A torque sensor 94 is provided on the steering shaft 92 to detect a steering torque. The torque sensor 94 has a first sensor unit 194 and a second sensor unit 294, each of which is capable of detecting its own failure. The pinion gear 96 is provided at an axial end of the steering shaft 92. The pinion gear 96 meshes with the rack shaft 97. The pair of wheels 98 is connected to both ends of the rack shaft 97 through tie rods or the like.

When a driver rotates the steering wheel 91, the steering shaft 92 connected to the steering wheel 91 rotates. A rotational movement of the steering shaft 92 is converted into a linear movement of the rack shaft 97 by the pinion gear 96. The pair of wheels 98 is steered to an angle corresponding to the displacement amount of the rack shaft 97.

The electric power steering device 8 includes a drive device 40, a reduction gear 89, and the like. The drive device 40 includes a motor 80, an ECU 10, and the like. The reduction gear 89, which is one of a power transmission unit, decelerates the rotation of the motor 80 and transmits it to the steering shaft 92. In other words, the electric power steering device 8 according to the present embodiment is a so-called "column assist type", but may be a so-called "rack assist type" which transmits the rotation of the motor 80 to the rack shaft 97. In the present embodiment, the steering shaft 92 corresponds to a "drive target".

Figure 2:
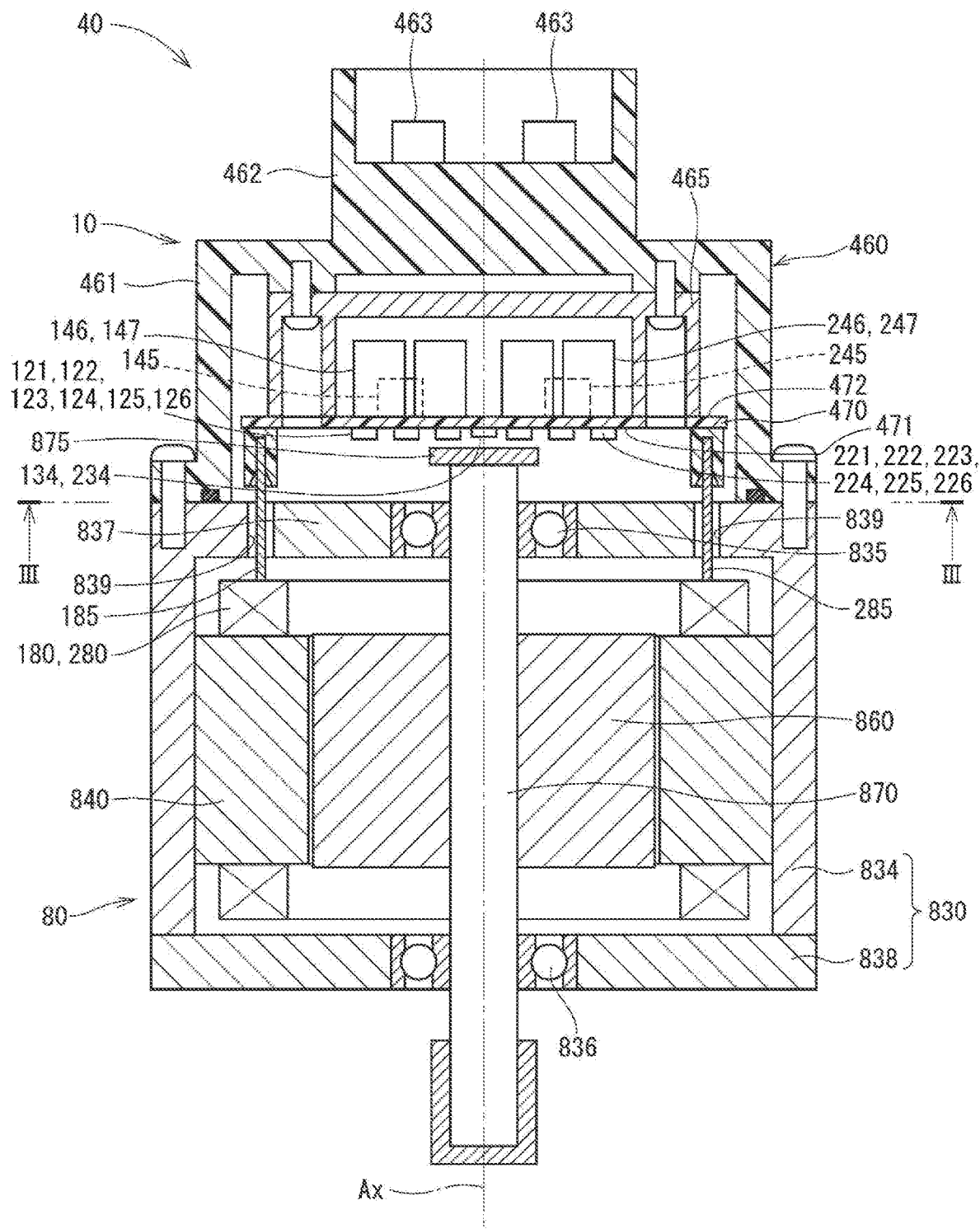
FIG. 2 is a cross-sectional view showing a drive device according to an embodiment.
Figure 3:
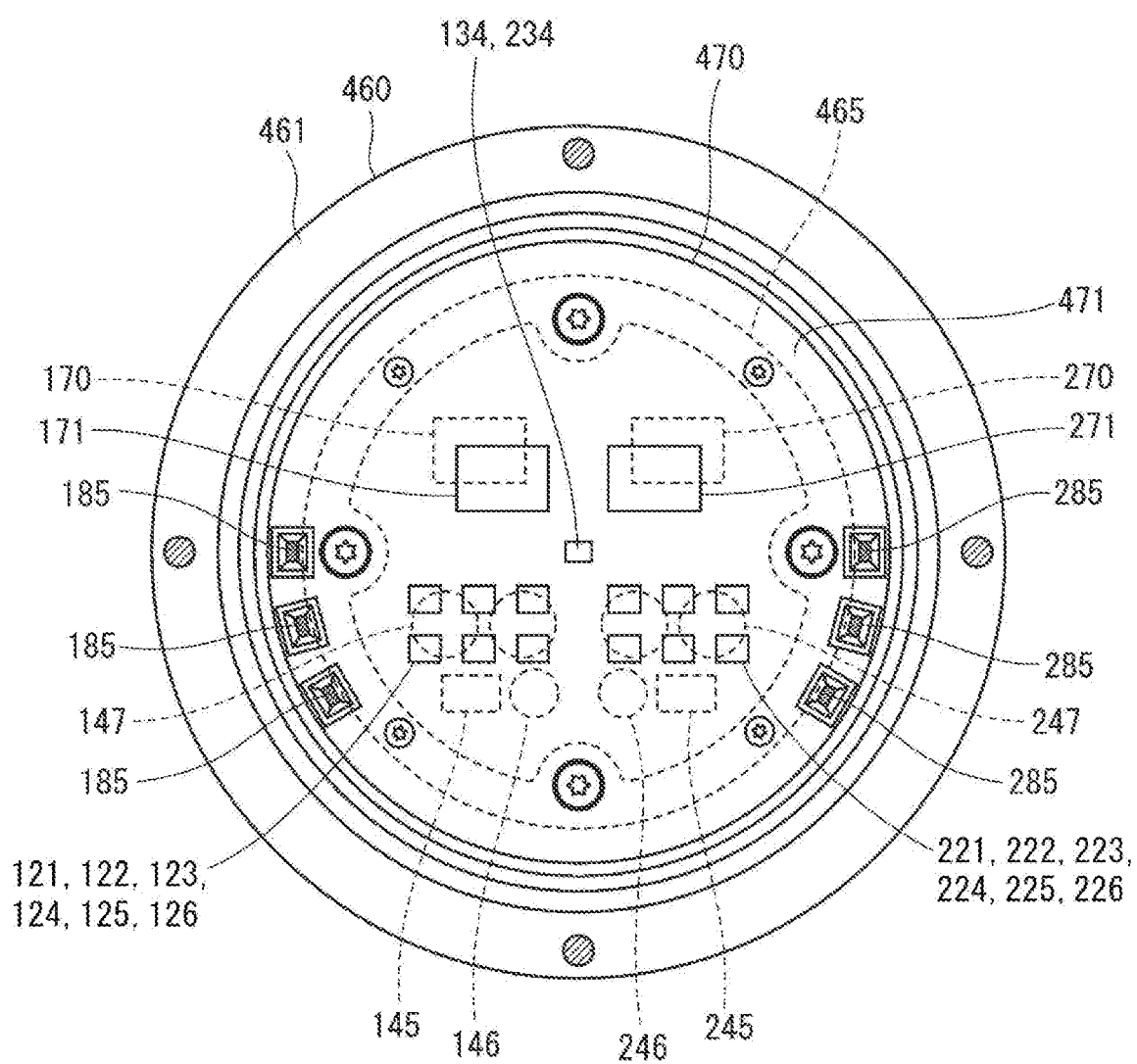
FIG. 3 is a cross sectional view taken along the line III-III of FIG. 2.
Figure 4:
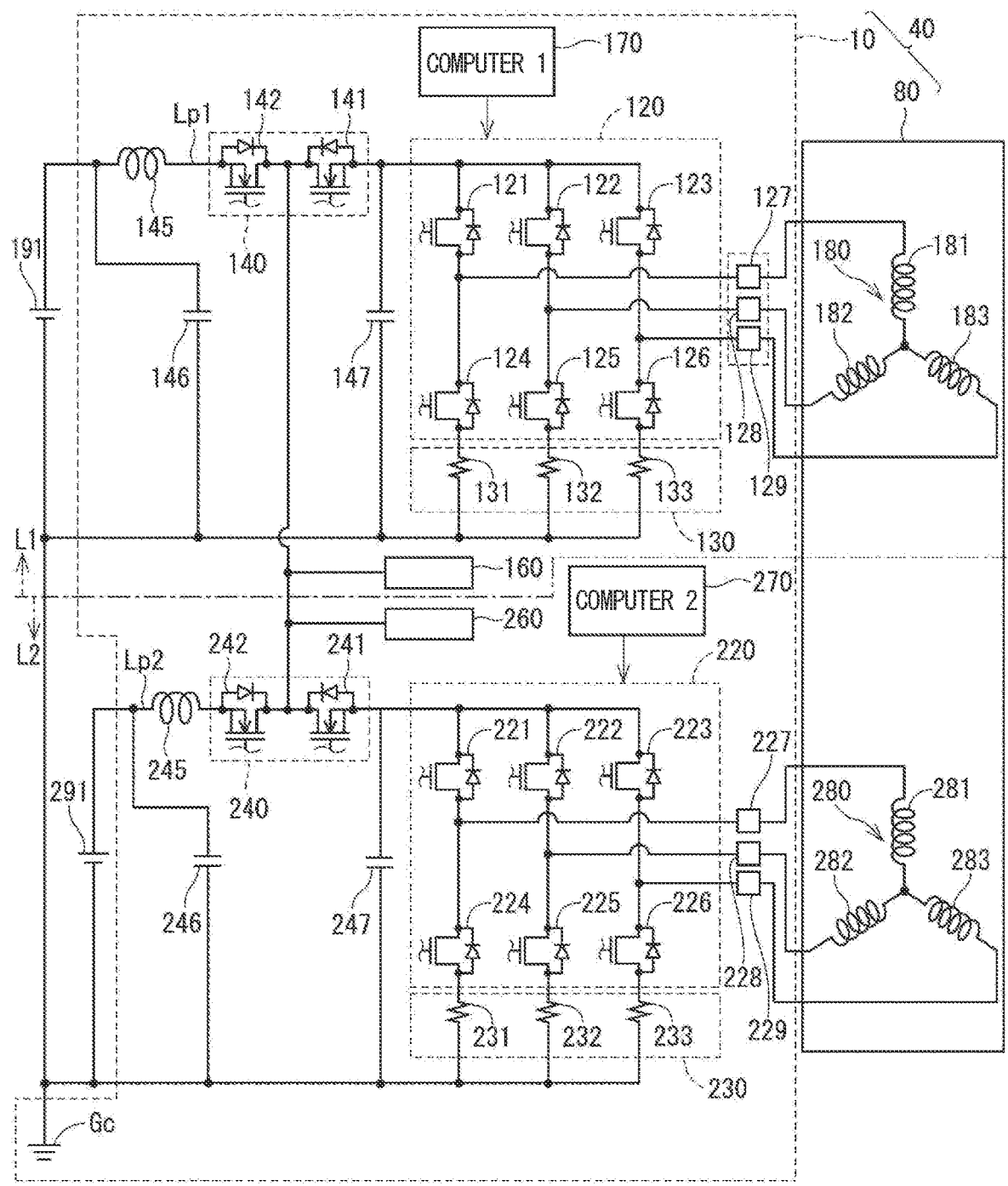
FIG. 4 is a circuit diagram showing a drive device according to an embodiment.

As shown in FIG. 2 to FIG. 4, the motor 80 outputs a whole or a part of a torque required for a steering operation. The motor 80 is driven by electric power supplied from batteries 191 and 291 provided as an external power source in order to rotate the reduction gear 89 in forward and reverse directions. The motor 80 is a three-phase brushless motor, but may be a motor other than the three-phase brushless motor.

The motor 80 has a first motor winding 180 and a second motor winding 280 as a winding set. The motor windings 180 and 280 have the same electrical characteristics and are wound about a stator 840 (see FIG. 2) with electrical angles changed from each other by 30 degrees. Correspondingly, phase currents are controlled to be supplied to the motor windings 180 and 280 such that the phase currents have a phase difference $\varphi$ of 30 degrees. By optimizing the current supply phase difference, the output torque can be improved. In addition, sixth-order torque ripple can be reduced, and noise and vibration can be reduced. In addition, since heat is also distributed and averaged by distributing the current, it is possible to reduce temperature-dependent system errors such as a detection value and torque of each sensor and increase the amount of current that is allowed to be supplied. The motor windings 180 and 280 do not have to be cancel windings, and may have different electrical characteristics.

Hereinafter, a combination of a first inverter 120 and a first control unit 170 and the like, which are related to the driving control for the first motor winding 180, is referred to as a first system L1, and a combination of a second inverter 220 and a second control unit 270 and the like, which are related to the driving control for the second motor winding 280, is referred to as a second system L2. The configuration related to the first system L1 is basically indicated with reference numerals of 100, and the configuration related to the second system L2 is basically indicated with reference numerals of 200. Further, in the first system L1 and the second system L2, similar or similar configurations are numbered so that the last two digits are the same, and the description relating to the configuration of the second system L2 and the like is omitted as appropriate. For the other configuration described below, the term "first" is indicated with a suffix "1," and the term "second" is indicated with a suffix "2."

In the drive device 40, the ECU 10 is integrally provided on one side in the axial direction of the motor 80 in a machine-electronics integrated type. The motor 80 and the ECU 10 may alternatively be provided separately. The ECU 10 is positioned coaxially with an axis Ax of a shaft 870 on the side opposite to the output shaft of the motor 80. The ECU 10 may alternatively be provided on the output shaft side of the motor 80. With the electromechanical integrated type, the ECU 10 and the motor 80 can be efficiently placed in a vehicle having a limited mounting space.

The motor 80 includes the stator 840, a rotor 860 and a housing 830 which houses the stator 840 and the rotor 860 therein. The stator 840 is fixed to the housing 830 and the motor windings 180 and 280 are wound thereon. The rotor 860 is provided radially inward of the stator 840 and rotatable relative to the stator 840.

The shaft 870 is fitted firmly in the rotor 860 to rotate integrally with the rotor 860. The shaft 870 is rotatably supported by the housing 830 through bearings 835 and 836. The end portion of the shaft 870 on the ECU 10 side protrudes from the housing 830 toward the ECU 10. A magnet 875 is provided at the axial end of the shaft 870 on the ECU 10 side. A center of the magnet 875 is arranged on the axis Ax.

The housing 830 has a bottomed cylindrical case 834, which has a rear end frame 837, and a front end frame 838 provided on an open side of the case 834. The case 834 and the front end frame 838 are fastened to each other by bolts or the like. Lead wire insertion holes 839 are formed in the rear end frame 837. Lead wires 185 and 285 connected to each phase of the motor windings 180 and 280 are inserted through the lead wire insertion holes 839. The lead wires 185 and 285 are taken out from the lead wire insertion holes 839 to the ECU 10 side and connected to a substrate 470.

The ECU 10 includes a cover 460 and a heat sink 465 fixed to the cover 460 in addition to the substrate 470 fixed to the heat sink 465. The ECU 10 further includes various electronic components and the like mounted on the substrate 470. The cover 460 protects the electronic components from external impacts and prevents dust, water or the like from entering into the ECU 10. In the cover 460, a cover main body 461 and a connector member 462 are integrally formed. The connector member 462 may be separate from the cover main body 461. Terminals 463 of the connector member 462 are connected to the substrate 470 via a wiring (not shown) or the like. The number of connectors and the number of terminals may be changed in correspondence to the number of signals and the like. The connector member 462 is provided at the end portion in the axial direction of the drive device 40 and is open on the side opposite to the motor 80.

The substrate 470 is, for example, a printed circuit board, and is positioned to face the rear end frame 837. Two systems of electronic components are independently mounted on the substrate 470 for each system. According to the present embodiment, the electronic components are mounted on one substrate 470. The electronic components may alternatively be mounted on plural substrates.

Of the two principal surfaces of the substrate 470, one surface on the side of the motor 80 is referred to as a motor-side surface 471 and the other surface opposite from the motor 80 is referred to as a cover-side surface 472. As shown in FIG. 3, switching elements 121 to 126 configuring the first inverter 120, switching elements 221 to 226 configuring the second inverter 220, rotation angle sensors 134, 234, custom ICs 171, 271 and the like are mounted on the motor-side surface 471.

The custom ICs 171, 271 are provided with booster circuits 160, 260 (see FIG. 4), an amplifier circuit, a pre-driver, and the like. A boost voltage of the booster circuits 160 and 260 is higher than a supply voltages Vb1 and Vb2, and is used as a gate voltage of the switching elements 121 to 123 and 221 to 223 on a high potential side. The rotation angle sensors 134 and 234 are mounted at positions facing the magnet 875 to be able to detect a change in the magnetic field caused by the rotation of the magnet 875.

On the cover-side surface 472, inductors 145 and 245, capacitors 146, 147, 246, and 247, computers forming the control units 170 and 270, and the like are mounted. In FIG. 3, reference numerals 170 and 270 are assigned to the computers provided as the control units 170 and 270, respectively. Although not shown in FIG. 3, the motor relays 127 to 129, 227 to 229, current detection elements 131 to 133, 231 to 233, relays 141, 142, 241, and 242 and the like are also mounted on the motor-side surface 471 or on the cover-side surface 472.

Figure 5:
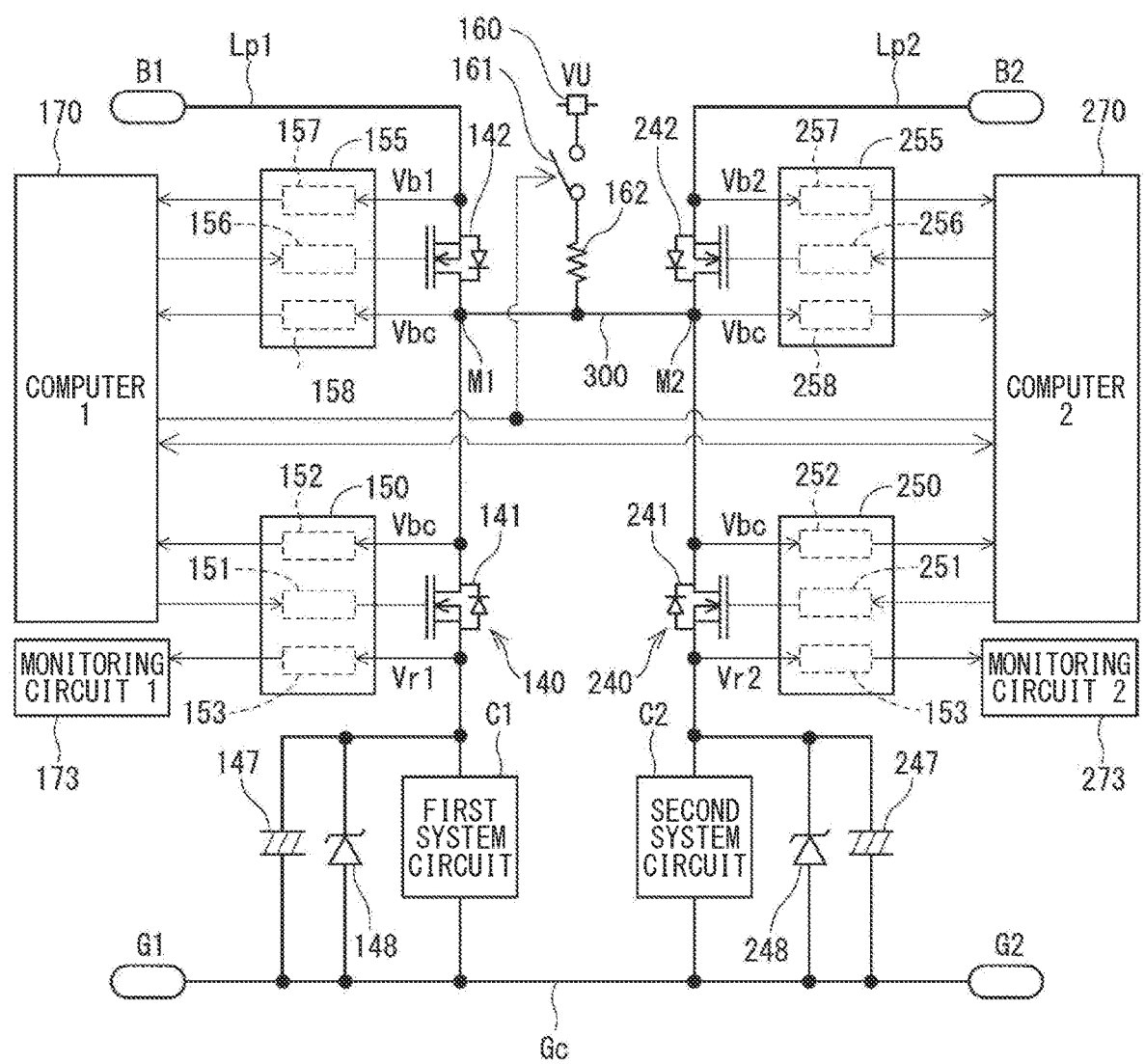
FIG. 5 is a circuit diagram illustrating a power supply relay unit according to an embodiment.

As shown in FIGS. 4 and 5, the ECU 10 includes inverters 120, 220, power relay units 140, 240, control units 170, 270, and the like. The energization of the first motor winding 180 is controlled by the first control unit 170, and the energization of the second motor winding 280 is controlled by the second control unit 270. In the present embodiment, the first system L1 and the second system L2 are provided independently of each other in a completely redundant configuration.

Each of the control circuits 170 and 270 is mainly composed of a microcomputer and the like, and internally includes, although not shown in the figure, a CPU, a ROM, a RAM, an I/O, a bus line for connecting these components, and the like. Each process executed by each of the control circuits 170 and 270 may be a software process or may be a hardware process. The software process may be implemented by causing the CPU to execute a program. The program may be stored beforehand in a memory device such as a ROM, that is, in a computer-readable, non-transitory, tangible storage medium. The hardware process may be implemented by a special purpose electronic circuit. In the figure, the control units 170 and 270 are referred to as "computers" as appropriate.

The first inverter 120 is a three-phase inverter, and the first switching elements 121 to 126 are connected in a bridge manner. The switching elements 121 to 123 are connected to the high potential side, and the switching elements 124 to 126 are connected to the low potential side. A connection point of the paired μ-phase switching elements 121 and 124 is connected to one end of a first U-phase coil 181. A connection point of the paired V-phase switching elements 122 and 125 is connected to one end of a first V-phase coil 182. A connection point of the paired W-phase switching elements 123 and 126 is connected to one end of a first W-phase coil 183. The other ends of the coils 181 to 183 are connected to one another. On the low potential side of the switching elements 124 to 126, a first current detection unit 130 for detecting the current of the coils 181 to 183 is provided. The first current detection unit 130 includes current detection elements 131 to 133.

The second inverter 220 is a three-phase inverter, and the second switching elements 221 to 226 are bridge-connected. The switching elements 221 to 223 are connected to the high potential side, and the switching elements 224 to 226 are connected to the low potential side. A connection point of the paired U-phase switching elements 221 and 224 is connected to one end of a second U-phase coil 281. A connection point of the paired V-phase switching elements 222 and 225 is connected to one end of a first V-phase coil 282. A connection point of the paired W-phase switching elements 223 and 226 is connected to one end of a first W-phase coil 283. The other ends of the coils 281 to 283 are connected to one another. On the low potential side of the switching elements 224 to 226, a second current detection unit 230 for detecting the current of the coils 281 to 283 is provided. The second current detection unit 230 is provided with current detection elements 231 to 233. Although the current detection elements 131 to 133 and 231 to 233 of the present embodiment are shunt resistors, other elements such as Hall elements may be used.

The first motor relays 127 to 129 are provided between the first inverter 120 and the first motor winding 180, and are provided to be able to connect and disconnect the first inverter 120 and the first motor winding 180. The motor relay 127 of the U-phase is provided between the connection point of switching elements 121 and 124 and the U-phase coil 181, and a motor relay 128 of the V-phase is provided between the connection point of switching elements 122 and 125 and the V-phase coil 182. The motor relay 129 of the W-phase is provided between the connection point of the switching elements 123 and 126 and the W-phase coil 183.

The second motor relays 227 to 229 are provided between the second inverter 220 and the second motor winding 280, and are provided to be able to connect and disconnect the second inverter 220 and the second motor winding 280. The motor relay 227 of the U-phase is provided between the connection point of switching elements 221 and 224 and the U-phase coil 281. The motor relay 228 of the V-phase is provided between the connection point of switching elements 222 and 225 and the V-phase coil 282. The motor relay 229 of the W-phase is provided between the connection point of the switching elements 223 and 226 and the W-phase coil 283.

A first power supply relay unit 140 is provided in a high potential side wiring Lp1 that connects a positive electrode of the first battery 191 and a high potential side of the first inverter 120. The first power supply relay unit 140 has a first power supply relay 141 and a first reverse connection protection relay 142. In the present embodiment, the relays 141 and 142 are MOSFETs and have a parasitic diode. Therefore, the two elements are connected in series so that the parasitic diodes of the relays 141 and 142 are oriented in opposite directions. Thereby, even when the first battery 191 is erroneously connected in the reverse direction, it is possible to prevent a reverse current from flowing. Details of the power relay units 140 and 240 will be described later.

The on/off operation of the first switching elements 121 to 126, the first motor relays 127 to 129, the power supply relay 141, and the reverse connection protection relay 142 is controlled based on the control signal from the first control unit 170. The on/off operation of the second switching elements 221 to 226, the second motor relays 227 to 229, the power supply relay 241 and the reverse connection protection relay 242 is controlled based on the control signal from the second control unit 270. In addition, in order to avoid complication, some control lines are omitted in the figure.

The inductor 145 is provided between the first battery 191 and the first power supply relay unit 140. In the capacitor 146, a positive electrode is connected between the first battery 191 and the inductor 145, and the negative electrode is connected to the common ground Gc. The inductor 145 and the capacitor 146 form a filter circuit to reduce noise transmitted from other devices sharing the first battery 191 and reduce noise transmitted from the drive device 40 to other devices sharing the first battery 191. In the capacitor 147, a positive electrode is connected between the power relay unit 140 and the first inverter 120, and the negative electrode is connected to the common ground Gc. In a Zener diode 148 (see FIG. 5), a cathode is connected between the power relay unit 140 and the first inverter 120, and an anode is connected to the common ground Gc. The capacitor 147 and the Zener diode 148 smooth the power supplied to the first inverter 120.

A second inverter 220 is connected to the second motor winding 280, and electric power is supplied to the second motor winding 280 from the second battery 291 via the second inverter 220. The second inverter 220 has switching elements 221 to 226. On the low potential side of the second inverter 220, the second current detection unit 230 having current detection elements 231 to 233 is provided. Further, motor relays 236 to 238 are provided between the second inverter 220 and the second motor winding 280.

A second power supply relay unit 240 is provided in a high potential side wiring Lp2 that connects a positive electrode of the second battery 291 and a high potential side of the second inverter 220. The inductor 245 is provided between the second battery 291 and the second power supply relay unit 240. In the capacitor 246, a positive electrode is connected between the second battery 291 and the inductor 245, and a negative electrode is connected to the common ground Gc. Further, in the capacitor 247, a positive electrode is connected between the power relay unit 240 and the second inverter 220, and a negative electrode is connected to the common ground Gc. In a Zener diode 248 (see FIG. 5), a cathode is connected between the power relay unit 240 and the second inverter 220, and an anode is connected to the common ground Gc. The details of the functions of each component are the same as those of the first system. In FIG. 5, the battery terminal of the first system L1 is described as B1, the ground terminal is described as G1, the battery terminal of the second system L2 is described as B2, and the ground terminal is described as G2.

As shown in FIG. 5, the first power supply relay 141 and the first reverse connection protection relay 142 have a "common drain" configuration, and are connected so that the drain is located inside and the source is located outside, and the parasitic diode has the anode located outside and the cathode located inside. Similarly, the second power supply relay 241 and the second reverse connection protection relay 242 have a "common drain" configuration and are connected so that the drain is located inside and the source is located outside, and the parasitic diode has the anode located outside and the cathode located inside. By adopting the common drain configuration, a lead frame and a chip are shared, and by separating the source by the chip, it is possible to make the size smaller than a common source configuration.

In the present embodiment, the first reverse connection protection relay 142 is provided on the first battery 191 side, and the first power supply relay 141 is provided on a first system circuit C1 side. Further, the second reverse connection protection relay 242 is provided on the second battery 291 side, and the second power supply relay 241 is provided on a second system circuit C2 side. The first system circuit C1 includes a configuration of a first inverter 120 and a first control unit 170 connected to a downstream side of the first power supply relay unit 140, but for the sake of explanation, the first control unit 170 and a first monitoring circuit 173 are described as blocks separate from the first system circuit C1 in FIG. 5. The same applies to the second system circuit C2.

In the present embodiment, an intermediate point M1 between the first power supply relay 141 and the first reverse connection protection relay 142 and an intermediate point M2 between the second power supply relay 241 and the second reverse connection protection relay 242 are connected by a relay-to-relay connection line 300. Therefore, a relay intermediate voltage Vbc becomes the same in the systems L1 and L2.

A first power supply relay control circuit 150 is provided corresponding to the first power supply relay 141, and a second power supply relay control circuit 250 is provided corresponding to the second power supply relay 241. The first power supply relay control circuit 150 is provided with a first power supply relay driver 151 and voltage monitor circuits 152 and 153. The second power supply relay control circuit 250 is provided with a second power supply relay driver 251 and voltage monitor circuits 252 and 253.

The first power supply relay driver 151 switches on/off of the first power supply relay 141 by outputting a gate signal to the first power supply relay 141 based on a control signal from the first control unit 170. The second power supply relay driver 251 switches on/off of the second power supply relay 241 by outputting a gate signal to the second power supply relay 241 based on a control signal from the second control unit 270.

The voltage monitor circuits 152, 153, 252, and 253 are, for example, voltage dividing resistors and the like. The voltage monitor circuit 152 detects a relay intermediate voltage Vbc and outputs it to the first control unit 170, and the voltage monitor circuit 153 detects a post-relay voltage Vr1 and outputs it to the first monitoring circuit 173. The voltage monitor circuit 252 detects the relay intermediate voltage Vbc and outputs it to the second control unit 270, and the voltage monitor circuit 253 detects a post-relay voltage Vr2 and outputs it to the second monitoring circuit 273.

A first supply regeneration control circuit 155 is provided corresponding to the first reverse connection protection relay 142, and a second supply regeneration control circuit 255 is provided corresponding to the second reverse connection protection relay 242. The first supply regeneration control circuit 155 is provided with a first reverse connection protection relay driver 156 and voltage monitor circuits 157 and 158. The second supply regeneration control circuit 255 is provided with a second reverse connection protection relay driver 256 and voltage monitor circuits 257 and 258.

The first reverse connection protection relay driver 156 switches on/off of the first reverse connection protection relay 142 by outputting a gate signal to the first reverse connection protection relay 142 based on the control signal from the first control unit 170. The second reverse connection protection relay driver 256 switches on/off of the second reverse connection protection relay 242 by outputting a gate signal to the second reverse connection protection relay 242 based on the control signal from the second control unit 270.

The voltage monitor circuits 157, 158, 257, and 258 are, for example, voltage dividing resistors. The voltage monitor circuit 157 detects the first supply voltage Vb1 and outputs it to the first control unit 170, and the voltage monitor circuit 158 detects the relay intermediate voltage Vbc and outputs it to the first control unit 170. The voltage monitor circuit 257 detects the second supply voltage Vb2 and outputs it to the second control unit 270, and the voltage monitor circuit 258 detects the relay intermediate voltage Vbc and outputs it to the second control unit 270. The first supply voltage Vb1 is the voltage supplied from the first battery terminal B1 connected to the first battery 191 and the second supply voltage Vb2 is the voltage supplied from the second battery terminal B2 connected to the second battery 291.

The booster circuits 160 and 260 are connected to the relay-to-relay connection line 300. Since it is sufficient that one of the booster circuits 160 and 260 is connected to the relay-to-relay connection line 300, the booster circuit 160 of the first system L1 will be described below assuming that it is connected to the relay-to-relay connection line 300. Further, regarding a boost voltage of the booster circuit 160, "1" indicating the system is omitted, and the boost voltage Vu is simply used.

The booster circuit 160 is connected to the relay-to-relay connection line 300 via a booster switch 161 and a resistor 162. The opening and closing of the booster switch 161 is controlled by the first control unit 170, and the connection and disconnection between the booster circuit 160 and the relay-to-relay connection line 300 can be switched. The booster switch 161 may be a semiconductor relay or a mechanical relay. A resistance value of the resistor 162 is set so as to limit the current from the booster circuit 160 to the relay-to-relay connection line 300 when the booster switch 161 is closed. The booster switch 161 is turned on at the time of initial check and when the internal voltage drops. Details of the initial check will be described later.

In the present embodiment, the parasitic diodes of the reverse connection protection relays 142 and 242 provided on the battery 191 and 291 sides are provided so as to allow the current from the high potential side to the low potential side. The intermediate point M1 of the relays 141 and 142 and the intermediate point M2 of the relays 241 and 242 are connected by the relay-to-relay connection line 300. As a result, even if a power supply abnormality such as a voltage drop occurs in the first system L1, it is possible to supply power to the first system L1 via the relay-to-relay connection line 300 from the second battery 291 without stopping the first system circuit C1 and the second system circuit C2. Further, even if a power supply abnormality such as a voltage drop occurs in the second system L2, it is possible to supply power to the second system L2 via the relay-to-relay connection line 300 from the first battery 191 without stopping the first system circuit C1 and the second system circuit C2. Here, the power supply abnormality of the first system L1 is not limited to the abnormality of the first battery 191 itself, but also includes a wiring abnormality and the like. The same applies to the power supply abnormality of the second system L2.

Figure 6:
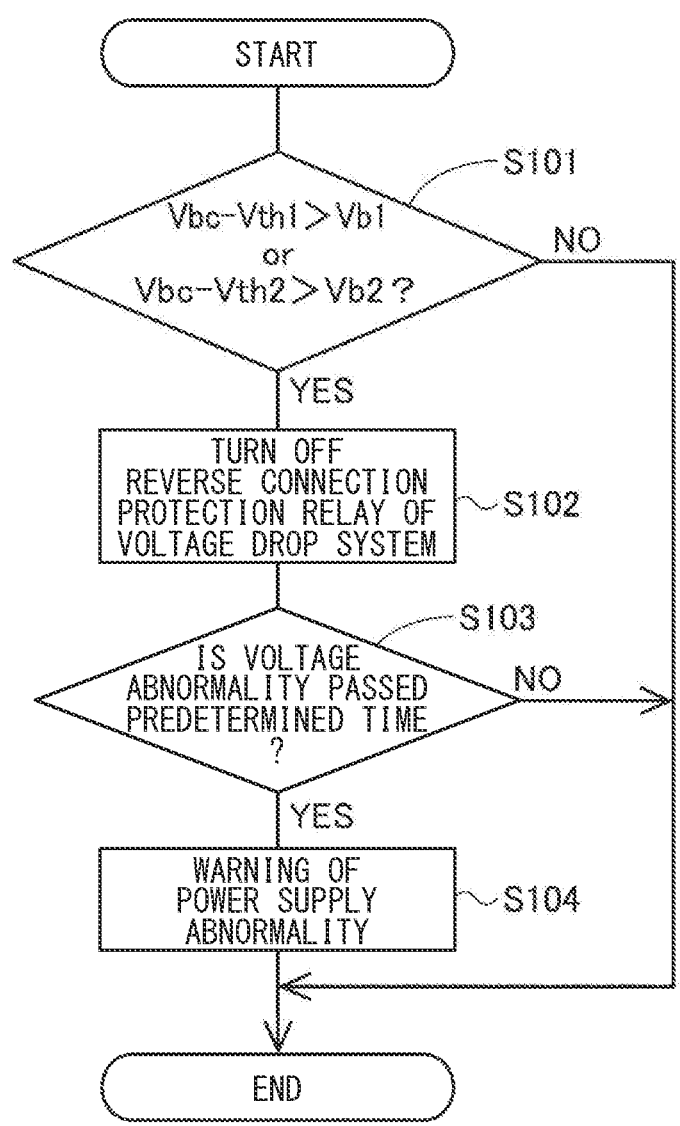
FIG. 6 is a flowchart illustrating a voltage drop determination process according to an embodiment.

A voltage drop determination process of the present embodiment will be described with reference to the flowchart of FIG. 6. This process is executed by the control units 170 and 270 at a predetermined cycle when a start switch of the vehicle such as a ignition switch is turned on. Necessary information is shared by communication between the control units 170 and 270. Hereinafter, "step" in step S101 is omitted, and is simply referred to as a symbol "S." Further, the supply voltages Vb1 and Vb2 within a normal range are supplied to both the systems L1 and L2, and the power supply relays 141 and 241 are turned on.

In S101, the control units 170 and 270 determine whether or not a voltage drop has occurred. In the present embodiment, if an equation (1) is satisfied, it is determined that a voltage drop has occurred in the first system L1, and if an equation (2) is established, it is determined that a voltage drop is occurred in the second system L2. Vth1 and Vth2 in the equation are voltage drop determination values and are set according to a drop voltage of the reverse connection protection relays 142 and 242.

$$Vbc - Vth1 > Vb1 \tag{1}$$

$$Vbc - Vth2 > Vb2 \tag{2}$$

When it is determined that no voltage drop has occurred in the systems L1 and L2 (S101: NO), the process after S102 is skipped. When it is determined that a voltage drop has occurred in any of the systems L1 and L2 (S101: YES), the process proceeds to S102. Hereinafter, the system in which the voltage drop occurs is referred to as a voltage drop system, and the system in which the voltage drop does not occur is referred to as a normal system.

In S102, the control units 170 and 270 turn off the reverse connection protection relays 142 and 242 of the voltage drop system. That is, when the voltage drop occurs in the first system L1, the reverse connection protection relay 142 is turned off, and when the voltage drop occurs in the second system L2, the reverse connection protection relay 242 is turned off. As a result, a power supply of the voltage drop system is cut off. Power is supplied to the voltage drop system from the normal system via the relay-to-relay connection line 300 without interrupting the power supply.

In S103, the control units 170 and 270 determine whether or not the state in which the voltage drop has occurred has passed an abnormality determination time Xth or more in the voltage drop system. In the present embodiment, when the state in which an equation (3) is established continues for the abnormality determination time Xth or more, the abnormality is determined. Vthe in the equation (3) is arbitrarily set according to a value allowed as a voltage drop. Further, #in the equation indicates a system, and # is "1" if the voltage drop system is the first system L1 and # is "2" if the voltage drop system is the second system L2.

$$(Vbc-Vth\#)-Vb\#>Vthe \qquad (3)$$

When it is determined that the state in which the voltage drop occurs is less than the abnormality judgment time Xth (S103: NO), the reverse connection protection relay of the voltage drop system is continuously turned off, and the power supply from the normal system to both systems is continued. When it is determined that the state in which the voltage drop has occurred has passed the abnormality determination time Xth or more (S103: YES), the process proceeds to S104.

In S104, the control units 170 and 270 determine the power supply abnormality of the voltage drop system, and warn the user that the power supply abnormality has occurred, for example, by lighting a warning lamp of an instrument panel. A warning method may be a method other than lighting the warning light, such as voice. This warning encourages users to bring vehicle to dealers and repair shops.

In the present embodiment, when a voltage drop occurs in one system, power is supplied from the normal system to both systems by turning off the reverse connection protection relay of the voltage drop system. Here, when a large amount of regenerative power is generated, if the power exceeding the allowable amount is supplied to the power supply system of the normal system, the battery of the normal system may be destroyed. Therefore, in the present embodiment, the circuit is protected by controlling the on/off of the reverse connection protection relays 142 and 242 according to the relay intermediate voltage Vbc.

Figure 7:
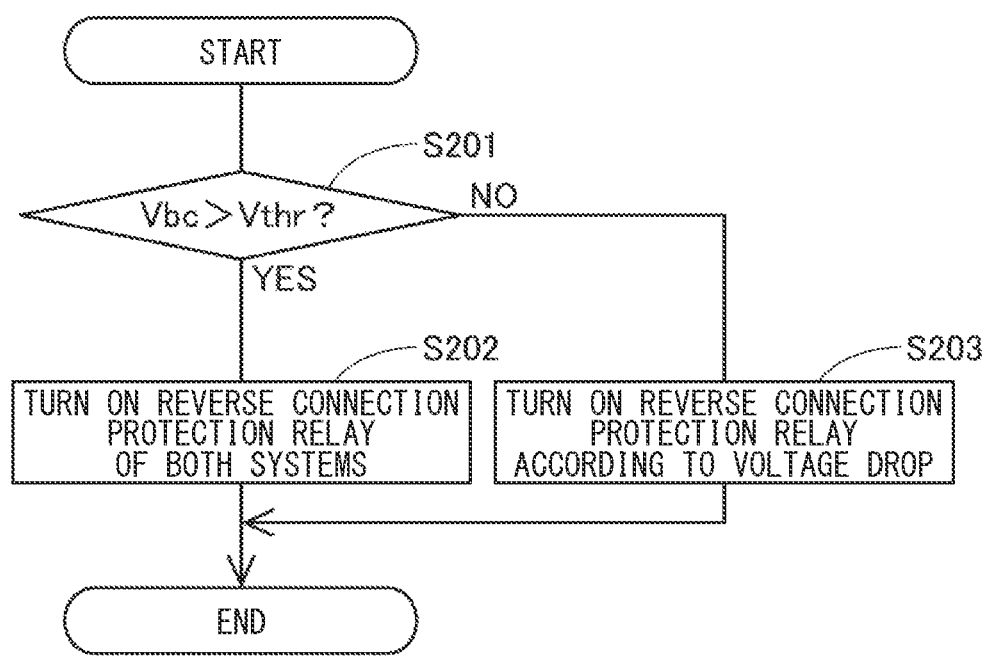
FIG. 7 is a flowchart illustrating a regeneration process according to an embodiment.

A regenerative process of the present embodiment will be described with reference to the flowchart of FIG. 7. This process is executed by the control units 170 and 270 at a predetermined cycle when the regenerative voltage is generated. In S201, the control units 170 and 270 determine whether or not the relay intermediate voltage Vbc is larger than a regeneration determination value Vthr. The regeneration determination value Vthr is set to an arbitrary value that is larger than the normal upper limit value of the power supply voltage and smaller than a minimum value of a withstand voltage of the circuit component. When it is determined that the relay intermediate voltage Vbc is larger than the regeneration determination value Vthr (S201: YES), the process proceeds to S202, and when it is determined that the relay intermediate voltage Vbc is equal to or less than the regeneration determination value Vthr (S201: NO), the process proceeds to S203.

In S202, the control units 170 and 270 turn on the reverse connection protection relays 142 and 242 of both systems, and regenerate the electric power to the batteries 191 and 291 of both systems. That is, even if the reverse connection protection relay is turned off in the voltage drop system, if excessive regeneration occurs, the reverse connection protection relays 142 and 242 of both systems are turned on so that overregeneration to the normal system side is prevented by regenerating power on the voltage drop system side as well.

In S203, the control units 170 and 270 continue the on/off state of the reverse connection protection relays 142 and 242 according to the voltage drop state. When one of the reverse connection protection relays is turned off due to a voltage drop, the regenerative power is regenerated to the normal system side.

In the present embodiment, the relay-to-relay connection line 300 is configured so that a boost voltage higher than the supply voltages Vb1 and Vb2 can be applied from the booster circuit 160. This makes it possible to initially check the power relay units 140 and 240.

Figure 8:
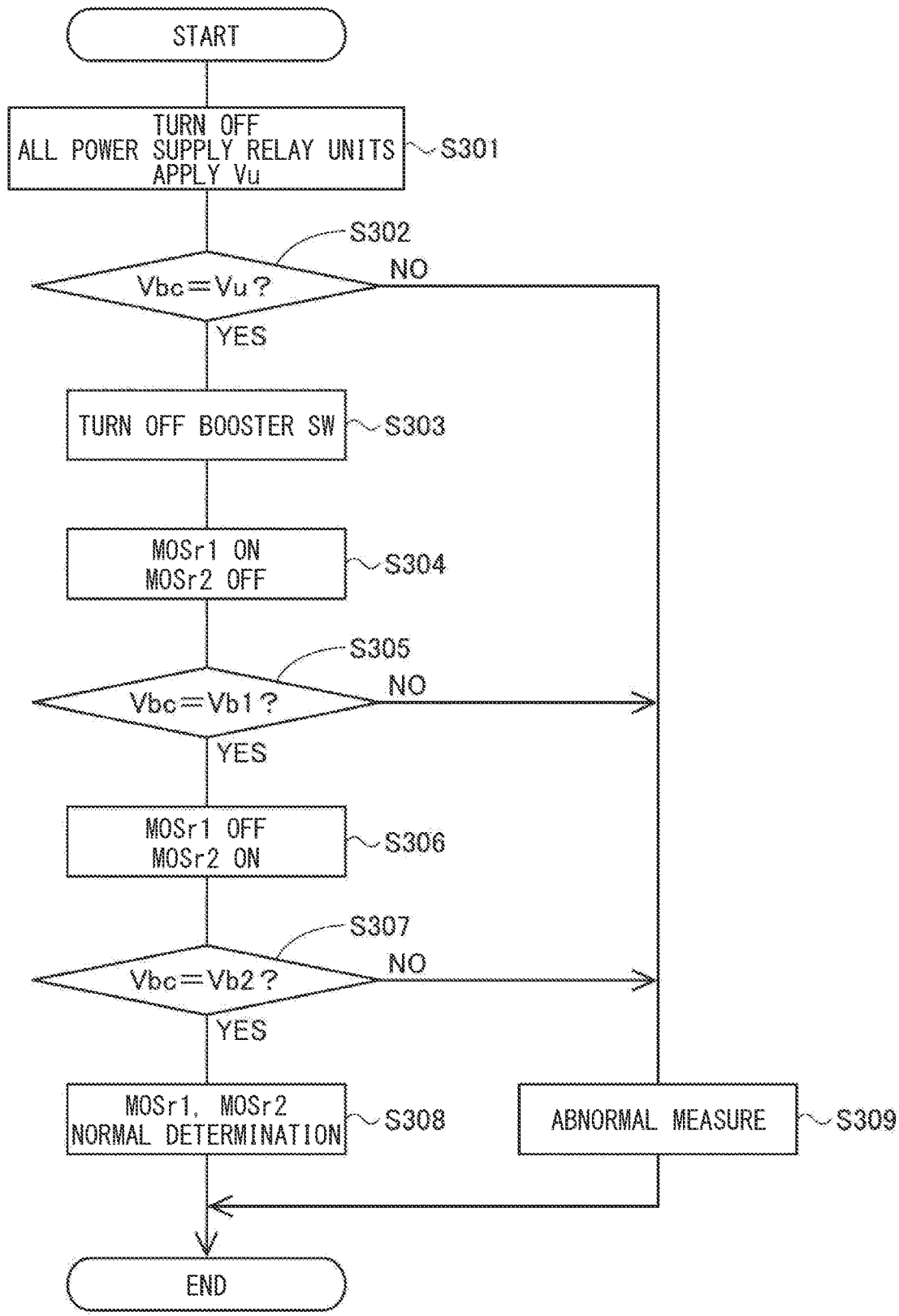
FIG. 8 is a flowchart illustrating an initial check process according to an embodiment.

The initial check process of the present embodiment will be described with reference to a flowchart of FIG. 8. This process is executed by the control units 170 and 270 when the start switch of the vehicle is turned on. In FIG. 8, the first reverse connection protection relay 142 is described as "MOSr1", and the second reverse connection protection relay 242 is described as "MOSr2".

In S301, the control units 170 and 270 turn off all the elements of the power supply relay units 140 and 240, that is, the power supply relays 141 and 241 and the reverse connection protection relays 142 and 242. Further, the control units 170 and 270 turn on the booster switch 161 and apply a boost voltage Vu to the relay-to-relay connection line 300. In the present embodiment, the resistor 162 is provided between the booster circuit 160 and the relay-to-relay connection line 300, and the boost voltage Vu is applied to the relay-to-relay connection line 300 in a state where the current is limited. The current may be limited by a configuration different from that of the resistor 162. Further, when a booster circuit, a booster switch and a resistor are provided for each system, the control units 170 and 270 may control the booster switch of the own system.

In S302, the control units 170 and 270 determine whether or not the relay intermediate voltage Vbc is equal to the boost voltage Vu. Here, if the relay intermediate voltage Vbc is within a normal determination range including the boost voltage Vu, it is considered that the relay intermediate voltage Vbc and the boost voltage Vu are equal. The same applies to the determinations of S305 and S306. The normal determination range can be set as appropriate. When it is determined that the relay intermediate voltage Vbc is different from the boost voltage Vu (S302: NO), the process proceeds to S309 and an abnormality measure is taken. When it is determined that the relay intermediate voltage Vbc is equal to the boost voltage Vu (S302: YES), the process proceeds to S303.

In S303, the control unit 170 turns off the booster switch 161. In S304, the control unit 170 turns on the first reverse connection protection relay 142. At this time, the second reverse connection protection relay 242 is left off.

In S305, the control units 170 and 270 determine whether or not the relay intermediate voltage Vbc is equal to the first supply voltage Vb1. When it is determined that the relay intermediate voltage Vbc is different from the first supply voltage Vb1 (S305: NO), the process proceeds to S309 and an abnormal measure is taken. When it is determined that the relay intermediate voltage Vbc is equal to the first supply voltage Vb1 (S305: YES), the process proceeds to S306. In S306, the first control unit 170 turns off the first reverse connection protection relay 142, and the second control unit 270 turns on the second reverse connection protection relay 242.

In S307, the control units 170 and 270 determine whether or not the relay intermediate voltage Vbc is equal to the second supply voltage Vb2. When it is determined that the relay intermediate voltage Vbc is different from the second supply voltage Vb2 (S307: NO), the process proceeds to S309 and an abnormal measure is taken. When it is determined that the relay intermediate voltage Vbc is equal to the second supply voltage Vb2 (S307: YES), the process proceeds to S308, and it is determined that the reverse connection protection relays 142 and 242 function normally.

An order of the processes of S304 and S305 and the processes of S306 and S307 may be changed. Further, the determination process of S305 may be performed by the first control unit 170, and the determination process of S307 may be performed by the second control unit 270.

The initial check for confirming that the power supply relays 141 and 241 function normally is performed by a separate process. Further, during normal driving, a current, a drain source voltage and an element overheating of the first power supply relay 141 are monitored, and if an abnormality is detected, the first power supply relay 141 is turned off and the operation in the second system L2 is continued. Further, during normal driving, a current, a drain source voltage and an element overheating of the second power supply relay 241 are monitored, and if an abnormality is detected, the second power supply relay 241 is turned off and the operation in the first system L1 is continued.

Figure 9:
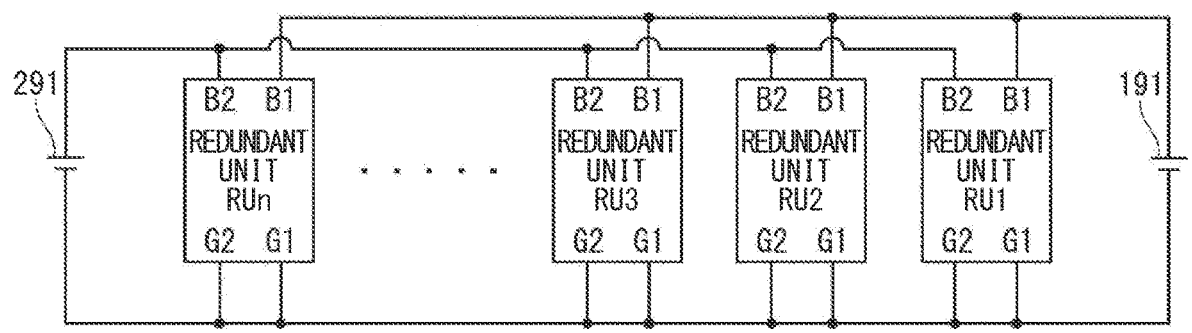
FIG. 9 is a schematic diagram showing a power supply system according to an embodiment.

As described above, the ECU 10 is a "redundant unit" having two systems, the first system L1 being connected to the first battery 191 and the second system L2 being connected to the second battery 291. As shown in FIG. 9, a plurality of redundant units are connected to the batteries 191 and 291 to form a redundant power supply network. For example, the redundant unit RU1 is an electric power steering device, the redundant unit RU2 is an electric brake device, and so on, and each of the redundant units is a different device.

In the power supply system 501 shown in FIG. 9, in the plurality of redundant units RU1 to RUn, the first battery terminal B1 is connected to the first battery 191 and the second battery terminal B2 is connected to the second battery 291 in a system-specific parallel connection.

As described above, the ECU 10 of the present embodiment includes the first power supply relay unit 140, the second power supply relay unit 240, the relay-to-relay connection line 300, the first supply regeneration control circuit 155, the second supply regeneration control circuit 255, and the control units 170 and 270.

The first power supply relay unit 140 includes the first reverse connection protection relay 142, which is connected so that the anode of the parasitic diode is on the high potential side and the cathode is on the low potential side, and the first power supply relay 141, which is connected in series with the low potential side of the first reverse connection protection relay 142 so that the cathode of the parasitic diode is on the high potential side and the anode is on the low potential side, The first power supply relay unit 140 is connected to the first battery 191.

The second power supply relay unit 240 includes the second reverse connection protection relay 242, which is connected so that the anode of the parasitic diode is on the high potential side and the cathode is on the low potential side, and the second power supply relay 241, which is connected in series with the low potential side of the second reverse connection protection relay 242 so that the cathode of the parasitic diode is on the high potential side and the anode is on the low potential side, The second power supply relay unit 240 is connected to the second battery 291. The relay-to-relay connection line 300 connects the intermediate point M1 between the first reverse connection protection relay 142 and the first power supply relay 141 and the intermediate point M2 between the second reverse connection protection relay 242 and the second power supply relay 241.

The first supply regeneration control circuit 155 includes the first reverse connection protection relay driver 156 and the voltage monitor circuits 157, 158. The first reverse connection protection relay driver 156 drives the first reverse connection protection relay 142. The voltage monitor circuit 157 monitors the first supply voltage Vb1 on the high potential side of the first reverse connection protection relay 142. The voltage monitor circuit 158 monitors the relay intermediate voltage Vbc, which is the voltage of the relay-to-relay connection line 300, on the low potential side of the first reverse connection protection relay 142.

The second supply regeneration control circuit 255 includes the second reverse connection protection relay driver 256 and the voltage monitor circuits 257 and 258. The second reverse connection protection relay driver 256 drives the second reverse connection protection relay 242. The voltage monitor circuit 257 monitors the second supply voltage Vb2 on the high potential side of the second reverse connection protection relay 242. The voltage monitor circuit 258 monitors the relay intermediate voltage Vbc on the low potential side of the second reverse connection protection relay 242.

The control units 170 and 270 control the on/off operation of the reverse connection protection relays 142 and 242 based on the first supply voltage Vb1, the second supply voltage Vb2 and the relay intermediate voltage Vbc. In the present embodiment, since the reverse connection protection relays 142 and 242 and the power supply relays 141 and 241 are connected by the relay-to-relay connection line 300, even if an abnormality occurs in one of the batteries 191 and 291, it is possible to continue power supply to both systems from the other of the normal batteries 191 and 291. As a result, even if one of the batteries 191 and 291 has an abnormality, the operation can be continued appropriately.

The relay-to-relay connection line 300 is connected to the booster circuit 160 capable of supplying a higher voltage than that of the batteries 191 and 291 via the booster switch 161 and the resistor 162. When the boost voltage Vu from the booster circuit 160 is applied to the relay-to-relay connection line 300 in a state where all the relay elements of the power relay units 140 and 240 are off, and if the relay intermediate voltage Vbc and the boost voltage Vu do not match, the control units 170 and 270 determine that the abnormality is present. As described above, a difference of the degree of error is allowed, and if it is within the normal determination range, it is considered that the relay intermediate voltage Vbc and the boost voltage Vu match. This makes it possible to appropriately determine whether or not the reverse connection protection relays 142 and 242 function normally.

The control unit 170 turns off the first reverse connection protection relay 142 when it is determined that the first supply voltage Vb1 is abnormal based on the first supply voltage Vb1 and the relay intermediate voltage Vbc. Further, the control unit 270 turns off the second reverse connection protection relay 242 when it is determined that the second supply voltage Vb2 is abnormal based on the second supply voltage Vb2 and the relay intermediate voltage Vbc. As a result, it is possible to cut off the power supply system on the abnormal side while the power supply to the downstream side of the power supply relay units 140 and 240 is continued.

The first reverse connection protection relay 142 or the second reverse connection protection relay 242 that has been turned off due to an abnormality in the supply voltage is referred to as an abnormal system relay. When the regenerative power is generated and the relay intermediate voltage Vbc is larger than the regenerative determination value Vthr, the control units 170 and 270 turn on the abnormal system relay. As a result, when a relatively large regenerative power is generated, by regenerating the batteries 191 and 291 on both sides, it is possible to prevent the battery from being destroyed due to excessive regenerative power on the normal side.

The power supply system 501 includes redundant units RU1 to RUn in which the ECU 10 is provided for each unit, the first battery 191 and the second battery 291. The plurality of redundant units RU1 to RUn are connected in parallel to the batteries 191 and 291. Thereby, power can be appropriately supplied from the two batteries 191 and 291 to the plurality of redundant units RU1 to RUn.

In the present embodiment, the ECU 10 corresponds to an "electronic control unit", the first power supply relay 141 corresponds to a "first low potential side relay", the first reverse connection protection relay 142 corresponds to a "first high potential side relay", the second power supply relay 241 corresponds to a "second low potential side relay", and the second reverse connection protection relay 242 corresponds to a "second high potential side relay". Further, the first supply regeneration control circuit 155 corresponds to a "first relay control circuit", the first reverse connection protection relay driver 156 corresponds to a "first relay driver", the voltage monitor circuit 157 corresponds to a "first upper monitor circuit", the voltage monitor circuit 158 corresponds to a "first lower monitor circuit", the second supply regeneration control circuit 255 corresponds to a "second relay control circuit", the second reverse connection protection relay driver 256 corresponds to a "second relay driver", the voltage monitor circuit 257 corresponds to a "second upper side monitor circuit", and the voltage monitor circuit 258 corresponds to a "second lower side monitor circuit".

The booster switch 161 corresponds to a "switch" and the resistor 162 corresponds to a "current limiting circuit". Further, the first battery 191 corresponds to a "first external power supply", and the second battery 291 corresponds to a "second external power supply".

Other Embodiments

In the above embodiment, the first system and the second system are connected to the common ground. In another embodiment, the ground of the first system and the ground of the second system may be separated. Further, in the above embodiment, the first system circuit C1 is provided on the downstream side of the first power supply relay unit, and the second system circuit C2 is provided on the downstream side of the second power supply relay unit. In another embodiment, the circuit on the downstream side of the first power supply relay unit and the second power supply relay unit may be one system. Similarly, even if the configuration on the downstream side of the power supply relay unit is one system, the operation can be continued when the power supply system is abnormal.

In the above embodiment, a resistor is used as a current limiting circuit for limiting the current from the booster circuit to the relay-to-relay connection line. In other embodiments, the current limiting circuit may be configured with elements other than resistors.

Further, in the above embodiment, two motor windings, two inverter units and two control units are provided. In another embodiment, for example, one control circuit may be provided for a plurality of motor windings and a plurality of inverter circuits. A plurality of inverter circuits and a plurality of motor windings may be provided for one control circuit. That is, the numbers of the motor windings, inverter circuits and control circuits may be different.

In the above embodiment, the motor is a three-phase brushless motor. In other embodiments, the motor may be something other than a three-phase brushless motor. Further, the rotary electric machine may be a motor-generator that also has a function of a generator. Further, the load may be something other than the motor. In the above embodiment, the electronic control unit and the power supply system are applied to the electric power steering device. In other embodiments, the electronic control unit and the power supply system may be applied to a steering device other than the electric power steering device that controls steering, such as a steer-by-wire device. Further, the electronic control unit and the power supply system may be applied to an in-vehicle device other than the steering device or a device other than the in-vehicle device. The configuration on the downstream side of the power relay unit may be a circuit configuration different from that of the motor winding and the inverter related to the motor drive.

The control circuit and method described in the present disclosure may be implemented by a special purpose computer which is configured with a memory and a processor programmed to execute one or more particular functions embodied in computer programs of the memory. Alternatively, the control circuit described in the present disclosure and the method thereof may be realized by a dedicated computer configured as a processor with one or more dedicated hardware logic circuits. Alternatively, the control circuit and method described in the present disclosure may be realized by one or more dedicated computer, which is configured as a combination of a processor and a memory, which are programmed to perform one or more functions, and a processor which is configured with one or more hardware logic circuits. The computer programs may be stored, as instructions to be executed by a computer, in a tangible non-transitory computer-readable medium. The present disclosure is not limited to the embodiment described above but various modifications may be made within the scope of the present disclosure.

The present disclosure has been described in accordance with embodiments. However, the present disclosure is not limited to this embodiment and structure. This disclosure also encompasses various modifications and variations within the scope of equivalents. Furthermore, various combination and formation, and other combination and formation including one, more than one or less than one element may be made in the present disclosure.

What is claimed is:

1. An electronic control unit, comprising:
a first power supply relay unit including a first high potential side relay, which is connected so that an anode of a parasitic diode is on a high potential side and a cathode is on a low potential side, and a first low potential side relay, which is connected in series with the low potential side of the first high potential side relay so that a cathode of a parasitic diode is on the high potential side and an anode is on the low potential side, and being connected to a first external power source;
a second power supply relay unit including a second high potential side relay, which is connected so that an anode of a parasitic diode is on a high potential side and a cathode is on a low potential side, and a second low potential side relay, which is connected in series with the low potential side of the second high potential side relay so that a cathode of a parasitic diode is on the high potential side and an anode is on the low potential side, and being connected to a second external power source different from the first external power source;
a relay-to-relay connection line connecting an intermediate point between the first high potential side relay and the first low potential side relay and an intermediate point between the second high potential side relay and the second low potential side relay;
a first relay control circuit includes a first relay driver that drives the first high potential side relay, a first upper monitor circuit that monitors a first supply voltage on the high potential side of the first high potential side relay, and a first lower monitor circuit that monitors a relay intermediate voltage, which is a voltage of the relay-to-relay connection line on the low potential side of the first high potential side relay;
a second relay control circuit including a second relay driver that drives the second high potential side relay, a second upper monitor circuit that monitors a second supply voltage on the high potential side of the second high potential side relay, and a second lower monitor circuit that monitors a relay intermediate voltage on the low potential side of the high potential side of the second high potential side relay; and
a control unit configured to control an on/off operation of the first high potential side relay and the second high potential side relay based on the first supply voltage, the second supply voltage, and the relay intermediate voltage.

2. The electronic control unit according to claim 1, wherein
the relay-to-relay connection line is connected to a booster circuit capable of supplying a higher voltage than a first external power supply and a second external power supply via a switch and a current limiting circuit.

3. The electronic control unit according to claim 2, wherein
the control unit determines that an abnormality is present, when a boost voltage from the booster circuit is applied to the relay-to-relay connection line in a state where all relay elements of the first power supply relay unit and the second power supply relay unit are off, and if the relay intermediate voltage and the boost voltage do not match.

4. The electronic control unit according to claim 1, wherein
the control unit turns off the first high potential side relay when it is determined that the first supply voltage is abnormal based on the first supply voltage and the relay intermediate voltage, and turns off the second high potential side relay when it is determined that a second external power supply is abnormal based on the second supply voltage and the relay intermediate voltage.

5. The electronic control unit according to claim 4, wherein
when the first high potential side relay or the second high potential side relay that has been turned off due to an abnormality in the supply voltage is referred to as an abnormal system relay,
the control unit turns on the abnormal system relay, when regenerative power is generated and the relay intermediate voltage is larger than a regenerative determination value.

6. A power supply system, comprising:
a plurality of redundant units in which the electronic control unit according to claim 1 is provided for each unit;
a first external power supply; and
a second external power supply;
wherein
the plurality of redundant units are connected in parallel to the first external power supply and the second external power supply.

* * * * *